(12) United States Patent
Matsubara

(10) Patent No.: US 11,019,727 B2
(45) Date of Patent: May 25, 2021

(54) METHODS FOR PRODUCING CERAMIC SUBSTRATES AND MODULE COMPONENTS

(71) Applicant: Murata Manufacturing Co., Ltd., Nagaokakyo (JP)

(72) Inventor: Masashi Matsubara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 245 days.

(21) Appl. No.: 16/255,902

(22) Filed: Jan. 24, 2019

(65) Prior Publication Data

US 2019/0159344 A1 May 23, 2019

Related U.S. Application Data

(60) Division of application No. 15/178,686, filed on Jun. 10, 2016, now Pat. No. 10,231,343, which is a
(Continued)

(30) Foreign Application Priority Data

Feb. 28, 2014 (JP) ................................ 2014-038617

(51) Int. Cl.
*H05K 3/00* (2006.01)
*B28B 11/14* (2006.01)
(Continued)

(52) U.S. Cl.
CPC ............ *H05K 3/0052* (2013.01); *B28B 11/14* (2013.01); *B28B 11/243* (2013.01);
(Continued)

(58) Field of Classification Search
CPC .... H05K 1/0298; H05K 1/0306; H05K 1/115; H05K 1/181; H05K 2201/10015;
(Continued)

(56) References Cited

U.S. PATENT DOCUMENTS 6,938,332 B2 * 9/2005 Harada ................. H01L 21/481
156/182
10,231,343 B2 * 3/2019 Matsubara ........... H05K 1/0298
(Continued)

OTHER PUBLICATIONS

Matsubara, "Methods for Producing Ceramic Substrates and Module Components", U.S. Appl. No. 15/178,686, filed Jun. 10, 2016.

*Primary Examiner* — Minh N Trinh
(74) *Attorney, Agent, or Firm* — Keating & Bennett, LLP

(57) ABSTRACT

In a method for manufacturing ceramic substrates and module components, an unfired mother ceramic substrate is cut at predetermined positions for division into separate unfired ceramic substrates. The cut unfired mother ceramic substrate is pressed such that pressure is applied parallel or substantially parallel to its main surfaces so that the cross-sectional end surfaces created in the cutting step are joined. The unfired mother ceramic substrate including end surface junctions, resulting from joining of the cross-sectional end surfaces, is fired. The fired mother ceramic substrate is broken along the end surface junctions to divide it into separate ceramic substrates.

10 Claims, 15 Drawing Sheets

Related U.S. Application Data continuation of application No. PCT/JP2015/051353, filed on Jan. 20, 2015.

(51) Int. Cl.
| | |
|---|---|
| *B28B 11/24* | (2006.01) |
| *B28B 17/00* | (2006.01) |
| *B32B 18/00* | (2006.01) |
| *H05K 1/02* | (2006.01) |
| *H05K 1/03* | (2006.01) |
| *H05K 1/11* | (2006.01) |
| *H05K 1/18* | (2006.01) |
| *H05K 3/30* | (2006.01) |
| *H05K 3/46* | (2006.01) |

(52) U.S. Cl.
CPC .......... *B28B 17/0018* (2013.01); *B32B 18/00* (2013.01); *H05K 1/0298* (2013.01); *H05K 1/0306* (2013.01); *H05K 1/115* (2013.01); *H05K 1/181* (2013.01); *H05K 3/007* (2013.01); *H05K 3/303* (2013.01); *H05K 3/4644* (2013.01); *C04B 2237/64* (2013.01); *C04B 2237/68* (2013.01); *H01L 2224/97* (2013.01); *H05K 3/4629* (2013.01); *H05K 2201/1003* (2013.01); *H05K 2201/10015* (2013.01); *H05K 2201/10022* (2013.01); *H05K 2203/0228* (2013.01)

(58) Field of Classification Search
CPC . H05K 2201/10022; H05K 2201/1003; H05K 2203/0228; H05K 3/0052; H05K 3/007; H05K 3/303; H05K 3/4629; H05K 3/4644; B28B 11/14; B28B 11/243; B28B 17/0018; B32B 18/00; C04B 2237/64; C04B 2237/68; H01L 2224/97
See application file for complete search history.

(56) References Cited

U.S. PATENT DOCUMENTS

| | | | |
|---|---|---|---|
| 10,257,927 B2* | 4/2019 | Maeda | H05K 3/0052 |
| 2003/0008182 A1* | 1/2003 | Saitoh | C04B 35/6264 |
| | | | 428/699 |
| 2005/0008824 A1* | 1/2005 | Kawakami | H05K 3/0052 |
| | | | 428/167 |
| 2019/0159344 A1* | 5/2019 | Matsubara | H05K 1/181 |

\* cited by examiner

FIG. 1A
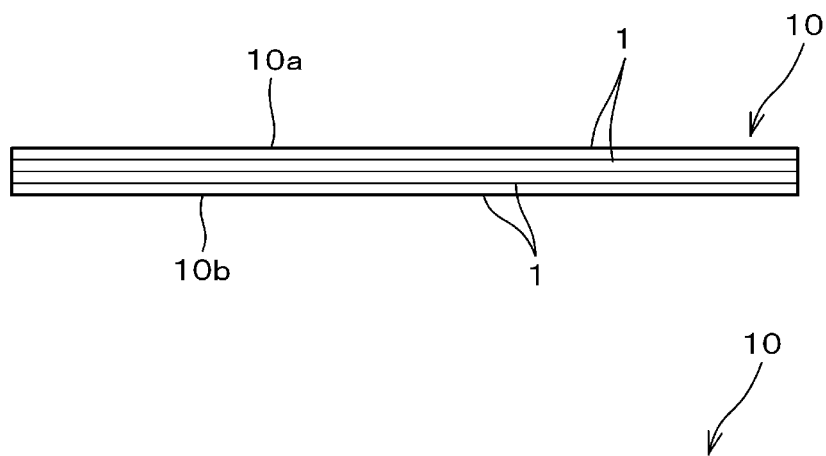
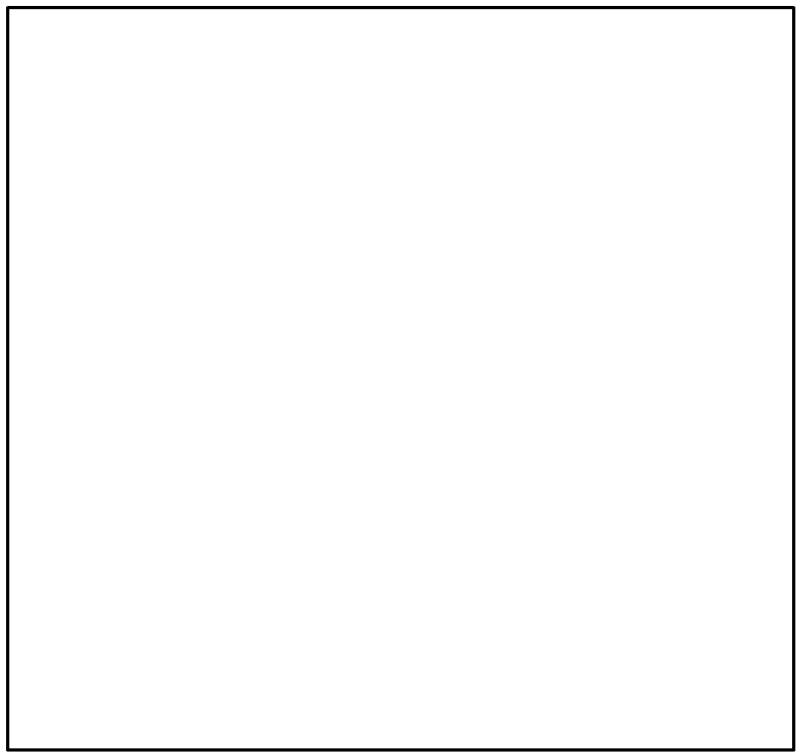
FIG. 1B

METHODS FOR PRODUCING CERAMIC SUBSTRATES AND MODULE COMPONENTS

CROSS REFERENCE TO RELATED APPLICATIONS

This application claims the benefit of priority to Japanese Patent Application 2014-0038617 filed Feb. 28, 2014 and is a Continuation Application of PCT/JP2015/051353 filed on Jan. 20, 2015. The entire contents of each application are hereby incorporated by reference.

BACKGROUND OF THE INVENTION

1. Field of the Invention

The present invention relates to methods for the production of ceramic substrates and module components and specifically to methods for the production of ceramic substrates and module components that are produced through a step of dividing a mother ceramic substrate into separate substrates.

2. Description of the Related Art

In the production of ceramic substrates, methods in which a fired mother ceramic substrate is divided into separate ceramic substrates are commonly used.

As a method for dividing a fired mother substrate into separate ceramic substrates of a predetermined size, for example, Japanese Unexamined Patent Application Publication No. 2005-15293 discloses a method in which a sintered ferrite substrate, which is a sintered ferrite plate (ceramic plate) with a layer of adhesive material on one surface, is cut with at least one continuous notch to provide a sintered ferrite substrate that can be divided starting from this continuous notch, and this is divided into separate ceramic substrates.

Japanese Unexamined Patent Application Publication No. 2007-165540 discloses a method for producing multilayer ceramic substrates in which a multilayer body that is a stack of multiple substrate green sheets, with an anti-shrinkage green sheet on each side thereof and at least one of the anti-shrinkage green sheets having a notch pattern on its surface as a guide for the formation of a notch for division, is cut with a notch for the division of the substrate in its surface using the notch pattern on the anti-shrinkage green sheet, fired, and then divided along the notch.

The methods disclosed in Japanese Unexamined Patent Application Publication No. 2005-15293 and Japanese Unexamined Patent Application Publication No. 2007-165540, however, need to be further improved. In these methods, as illustrated in FIGS. 20A and 20B, notches 201 for breaking are formed in one surface 200a of a mother substrate 200, and the mother substrate 200 is broken starting from these notches. This configuration makes it difficult to divide the mother substrate 200 while creating end surfaces 202 perpendicular to the surface 200a of the mother substrate 200 as intended, occasionally causing the end surfaces 202 to be angled as schematically illustrated in FIG. 21.

Furthermore, the methods disclosed in Japanese Unexamined Patent Application Publication No. 2005-15293 and Japanese Unexamined Patent Application Publication No. 2007-165540 are of poor production efficiency. When notches are formed in multiple mother substrates in these methods, in which notches 201 from which breaking starts are formed in a surface 200a of a mother substrate 200 as illustrated in FIGS. 20A and 20B, the notches 201 need to be formed in each of the mother substrates 200.

SUMMARY OF THE INVENTION

Preferred embodiments of the present invention provide methods for the production of ceramic substrates and module components that make it possible to divide a mother ceramic substrate while creating end surfaces perpendicular or substantially perpendicular to the surface of the mother ceramic substrate. These methods allow for efficient production of ceramic substrates with high form accuracy and module components composed of these ceramic substrates and surface mount devices thereon.

A method according to a preferred embodiment of the present invention for producing ceramic substrates is a method for producing ceramic substrates that are produced through a step of dividing a mother ceramic substrate at a predetermined position into a plurality of ceramic substrates. The method includes a cutting step in which an unfired mother ceramic substrate that has yet to be fired is cut at a predetermined position from one main surface through to the other main surface to divide the unfired mother ceramic substrate into separate unfired ceramic substrates; a pressing step in which the cut unfired mother ceramic substrate is pressed to apply pressure in the direction parallel or substantially parallel to the main surfaces thereof so that the cross-sectional end surfaces created in the cutting step are joined, combining the separate ceramic substrates into a single unit; a firing step in which the unfired mother ceramic substrate including an end surface junction, an area resulting from joining the cross-sectional end surfaces, is fired; and a dividing step in which the fired mother ceramic substrate is broken along the end surface junction to divide the mother ceramic substrate into separate ceramic substrates.

In a method according to a preferred embodiment of the present invention for producing ceramic substrates, the unfired mother ceramic substrate may have a multilayer structure formed by stacking a plurality of ceramic green sheets, and the ceramic substrates obtained by dividing the fired mother ceramic substrate in the dividing step may be multilayer ceramic substrates.

This configuration allows for efficient production of multilayer ceramic substrates, which have a structure in which multiple ceramic layers are stacked.

It is preferred that a stack of unfired mother ceramic substrates with a resin layer therebetween that disappears in the firing step go through the cutting and pressing steps and the firing step, in which the resin layer disappears, and then be subjected to the dividing step.

This configuration, in which a stack of a predetermined number of unfired mother ceramic substrates is subjected to the steps from cutting to firing, allows for efficient production of ceramic substrates (multiple ceramic substrates including single-layer and multilayer ceramic substrates).

In a method according to a preferred embodiment of the present invention for producing ceramic substrates, the unfired mother ceramic substrate(s) may include a conductor pattern made of a material that becomes a metallic conductor through firing so that the cutting, pressing, firing, and dividing steps provide ceramic substrates containing a metallic conductor.

This configuration allows for efficient production of ceramic substrates that contain conductors, such as circuits and electrodes.

A method according to a preferred embodiment of the present invention for producing module components is a method for producing module components that are produced through a step of dividing a mother ceramic substrate with surface mount devices thereon at a predetermined position into a plurality of separate ceramic substrates. The method preferably includes a cutting step in which an unfired mother ceramic substrate that has yet to be fired is cut at a predetermined position from one main surface through to the other main surface to divide the unfired mother ceramic substrate into separate unfired ceramic substrates; a pressing step in which the cut unfired mother ceramic substrate is pressed to apply pressure in the direction parallel or substantially parallel to the main surfaces thereof so that the cross-sectional end surfaces created in the cutting step are joined, combining the separate ceramic substrates into a single unit; a firing step in which the unfired mother ceramic substrate including an end surface junction, an area resulting from joining the cross-sectional end surfaces, is fired; a device-mounting step in which a surface mount device is mounted to each of the ceramic substrates in the fired mother ceramic substrate; and a dividing step in which the fired mother ceramic substrate, with the surface mount device on each of the ceramic substrates, is broken along the end surface junction to divide the mother ceramic substrate into separate module components each composed of each of the ceramic substrates and the surface mount device thereon.

In a method according to a preferred embodiment of the present invention for producing module components, the unfired mother ceramic substrate may have a multilayer structure formed by stacking a plurality of ceramic green sheets, and the ceramic substrates as a structural element of the module components obtained by dividing the fired mother ceramic substrate in the dividing step may be multilayer ceramic substrates.

This configuration allows for efficient production of module components each composed of a multilayer ceramic substrate, which has a structure in which multiple ceramic layers are stacked, and a surface mount device thereon.

It is preferred that a stack of unfired mother ceramic substrates with a resin layer therebetween that disappears in the firing step go through the cutting and pressing steps and the firing step, in which the resin layer disappears, and then each of the fired mother ceramic substrates be subjected to the device-mounting and dividing steps.

This configuration, in which a stack of a predetermined number of unfired mother ceramic substrates is subjected to the steps from cutting to firing, allows for efficient production of module components each composed of a single-layer or multilayer ceramic substrate and a surface mount device thereon.

It is desirable that the unfired mother ceramic substrate(s) contain a conductor pattern made of a material that becomes a metallic conductor through firing so that the cutting, pressing, firing, device-mounting, and dividing steps provide separate module components each composed of a ceramic substrate containing a metallic conductor and the surface mount device on the ceramic substrate.

This configuration allows for efficient production of module components each composed of a ceramic substrate and a surface mount device thereon with conductors, such as circuits and electrodes, in the ceramic substrate.

As described above, a method according to a preferred embodiment of the present invention for producing ceramic substrates includes a cutting step in which an unfired mother ceramic substrate is cut from one main surface through to the other main surface to divide it into separate unfired ceramic substrates, a pressing step in which the cut unfired mother ceramic substrate is pressed to join the cross-sectional end surfaces created in the cutting step to combine the separate ceramic substrates into a single unit, a firing step in which the unfired mother ceramic substrate including an end surface junction, an area resulting from joining the cross-sectional end surfaces, is fired, and a dividing step in which the fired mother ceramic substrate is broken along the end surface junction to divide it into separate ceramic substrates. This method, in which a fired mother ceramic substrate is broken along the end surface junction, ensures that the mother ceramic substrate is broken at a predetermined position, thus allowing the manufacturer to produce ceramic substrates having an intended shape with high efficiency.

The ceramic materials of which the ceramic substrates according to various preferred embodiments of the present invention can be made include a variety of ceramic materials such as magnetic ceramics, dielectric ceramics, piezoelectric ceramics, and semiconductor ceramics.

The ceramic substrates as used in various preferred embodiments of the present invention are not limited to what are called circuit boards, which are substrates that have circuits and related elements on their surface and/or inside them. Preferred embodiments of the present invention can also be applied when flat-plate ceramic articles are produced with no circuit conductors or other elements provided.

A method according to a preferred embodiment of the present invention for producing module components includes a cutting step in which an unfired mother ceramic substrate is cut from one main surface through to the other main surface to divide it into separate unfired ceramic substrates, a pressing step in which the cut unfired mother ceramic substrate is pressed to join the cross-sectional end surfaces created in the cutting step to combine the separate ceramic substrates into a single unit, a firing step in which the unfired mother ceramic substrate including an end surface junction, an area resulting from joining the cross-sectional end surfaces, is fired, a device-mounting step in which surface mount devices are mounted to the fired mother ceramic substrate, and a dividing step in which the fired mother ceramic substrate is broken along the end surface junction to divide it into separate module components. This method, in which a fired mother ceramic substrate is broken along the end surface junction, ensures that the mother ceramic substrate is broken at a predetermined position, thus allowing the manufacturer to produce with high efficiency module components each composed of a ceramic substrate in an intended shape and a surface mount device thereon.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a front view of an unfired mother ceramic substrate used in an preferred embodiment (Preferred Embodiment 1) of the present invention. FIG. 1B is a plan view of the same.

DETAILED DESCRIPTION OF THE PREFERRED EMBODIMENTS

The following describes preferred embodiments of the present invention.

Preferred Embodiment 1

Preferred Embodiment 1 provides a method in which ceramic substrates (multilayer ceramic substrates) of a magnetic ceramic material were produced.

A magnetic ceramic powder (a ferrite powder in Preferred Embodiment 1), a binder resin, and an organic solvent were mixed. After dissolution and dispersion, defoaming was performed to provide a starting ceramic slurry.

(1) The prepared starting ceramic slurry was applied to 50-μm-thick PET films (supporting films) and dried using known methods, such as doctor blading, to provide 50-μm-thick ceramic green sheets.

(2) The ceramic green sheets were punched to make 200 mm×200 mm pieces. The ceramic green sheet of each removed piece was separated from the PET film.

Four separated ceramic green sheets were stacked to provide a multilayer body having dimensions in plan view of 200 mm×200 mm and a thickness of 0.2 mm.

Each of the stacked ceramic green sheets may include thereon a surface conductor pattern that provides surface conductors, an inner conductor pattern that provides inner conductors, and via conductors that provides interlayer coupling.

(3) After degassing in a bag, the multilayer body was tightly sealed and heated to a predetermined temperature. Isostatic pressing was then performed at 20 MPa for 1 minute. This provided an unfired mother ceramic substrate 10 that was a pressure-bonded stack of four ceramic green sheets 1 as illustrated in FIGS. 1A and 1B.

Figure 2A:
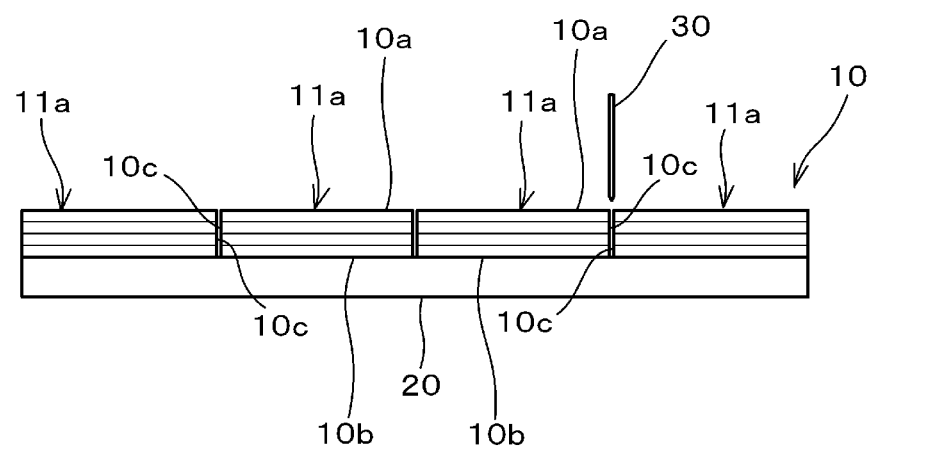
FIG. 2A is a front view of a cut unfired mother ceramic substrate in Preferred Embodiment 1 of the present invention.
Figure 2B:
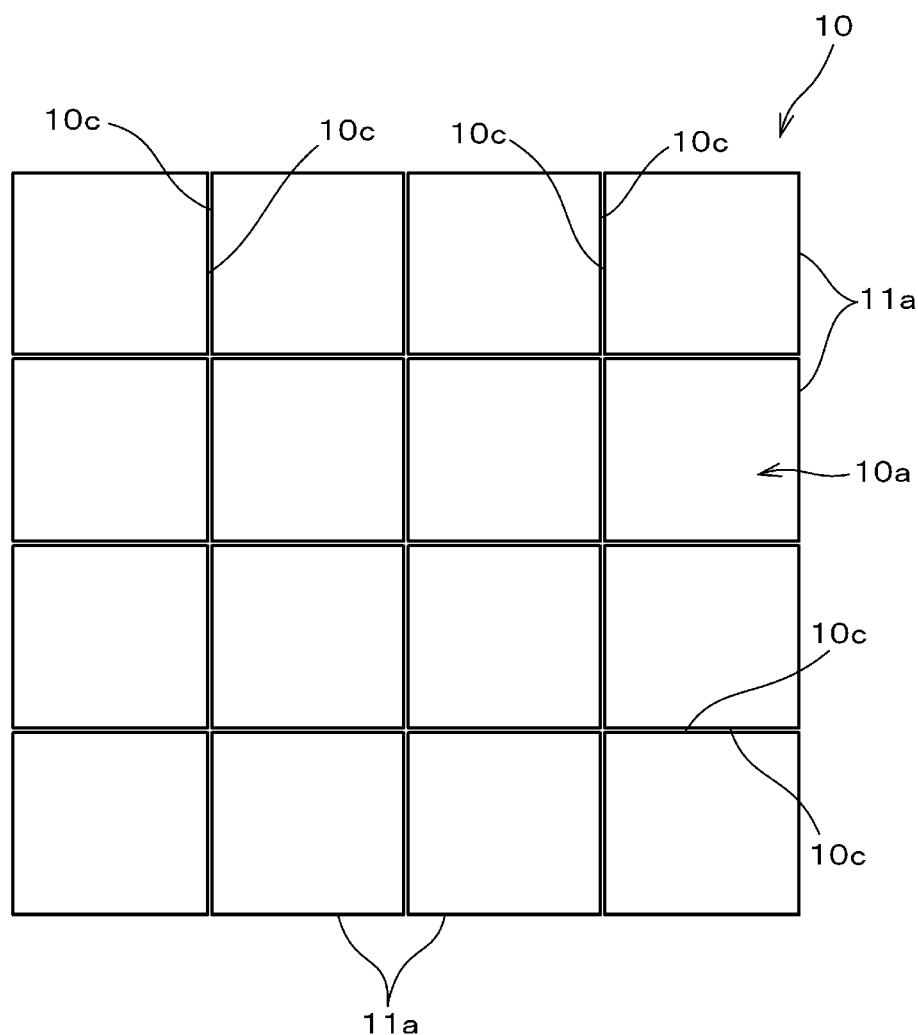
FIG. 2B is a plan view of the same.

(4) The unfired mother ceramic substrate 10 was cut at 2.44-mm intervals by push-cutting using a 0.10-mm-thick cutting blade 30 on an adhesive holding sheet 20 as illustrated in FIGS. 2A and 2B.

In this process of cutting the unfired mother ceramic substrate 10, the cutting blade 30 was infiltrated until its edge reached the adhesive holding sheet 20, i.e., from one main surface 10a of the unfired mother ceramic substrate 10 to the other main surface 10b.

The end surfaces 10c created through cutting (cross-sectional end surfaces) are perpendicular or substantially perpendicular to the main surfaces 10a and 10b of the unfired mother ceramic substrate 10.

While being cut, the unfired mother ceramic substrate 10 is stuck on the adhesive holding sheet 20. This ensures that the unfired mother ceramic substrate 10 is cut into completely separate pieces, but the cut pieces (individual pieces that are to be fired into ceramic substrates) 11a (FIGS. 2A and 2B) are held in the same positions as before cutting and do not break up.

(5) After degassing in a bag, the cut unfired mother ceramic substrate 10 was tightly sealed and heated to a predetermined temperature. Isostatic pressing was then performed at 100 MPa for 1 minute. In this step of isostatic pressing, the unfired mother ceramic substrate 10 is pressed such that pressure is applied not only in the direction perpendicular or substantially perpendicular to its main surfaces 10a and 10b but also in the direction parallel or substantially parallel to its main surfaces 10a and 10b. This provides an unfired mother ceramic substrate 10X that includes end surface junctions 10d, areas resulting from joining the end surfaces 10c created through cutting (cross-sectional end surfaces) (a joint unfired mother ceramic substrate existing as a whole unit as a result of the joining of the cross-sectional end surfaces 10c) (FIG. 3).

(6) The margins of the joint unfired mother ceramic substrate 10X are cut away to provide a 180 mm×180 mm joint body.

Figure 3:
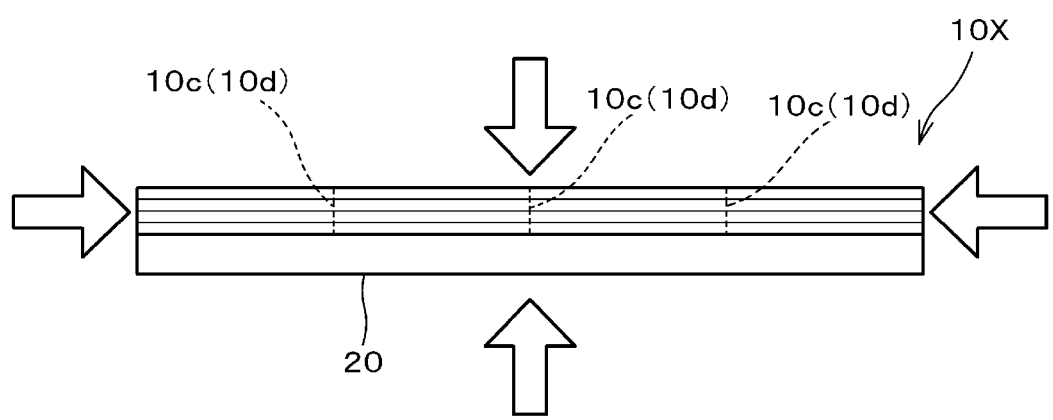
FIG. 3 is a front view of the cut unfired mother ceramic substrate in Preferred Embodiment 1 of the present invention that had been pressed to join the cross-sectional end surfaces created in the cutting step.

The unfired mother ceramic substrate illustrated in FIGS. 1 to 3 does not include the margins to be cut away.

Figure 4:
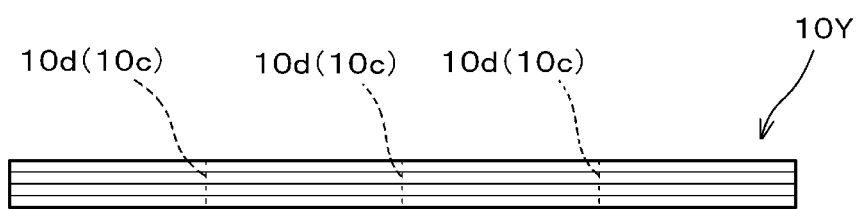
FIG. 4 is a front view of the unfired mother ceramic substrate that had been fired with its cross-sectional end surfaces joined.

(7) After removal of the adhesive holding sheet 20 from the joint body (joint unfired mother ceramic substrate) 10X, firing was performed at 950° C. for 2 hours to provide a sintered mother ceramic substrate 10Y (FIG. 4).

The end surfaces (cross-sectional end surfaces) 10c are still joined at this stage, holding the whole sintered mother ceramic substrate 10Y together as a single unit.

The sintered mother ceramic substrate 10Y has dimensions in plan view of 150 mm×150 mm and a thickness of 150 μm. The mother ceramic substrate also has areas 10d formed in the longitudinal and lateral directions at 2-mm intervals as a result of joining the cross-sectional end surfaces 10c (FIG. 3) and where the substrate is weaker than in the other areas and is to be divided (end surface junctions).

Figure 5:
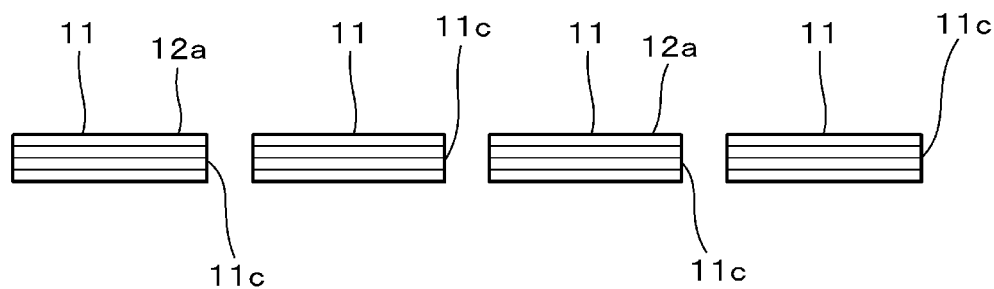
FIG. 5 is a front view of the fired mother ceramic substrate that had been divided into separate ceramic substrates.

(8) The sintered mother ceramic substrate 10Y was broken on a 10-μm-thick adhesive PET film (not illustrated) using a roller breaker to divide the sintered mother ceramic substrate 10Y into separate sintered ceramic substrates 11. As a result, the sintered mother ceramic substrate 10Y was divided along the end surface junctions 10d as illustrated in FIG. 5, and ceramic substrates (multilayer ceramic substrates) 11 were obtained with their end surfaces 11c resulting from division perpendicular or substantially perpendicular to their main surface 12a and therefore with high dimensional and form accuracy.

In this method according to Preferred Embodiment 1, end surface junctions 10d, which are areas resulting from joining end surfaces (cross-sectional end surfaces) and weaker than the other areas, provides planes for division. The mother substrate is broken to create the end surfaces (planes resulting from division) 11c of the resulting ceramic substrates 11 along the end surface junctions 10d as a guide. As a result, the ceramic substrates (multilayer ceramic substrates) 11 are obtained with the end surfaces 11c resulting from division perpendicular or substantially perpendicular to their main surface 12a, not angled.

Preferred Embodiment 2

Preferred Embodiment 2 provides a method for the production of ceramic substrates in which the ceramic substrates are produced more efficiently than in Preferred Embodiment 1.

(1) Ceramic green sheets identical to those prepared in Preferred Embodiment 1 were prepared in the same way in Preferred Embodiment 1.

In Preferred Embodiment 2, too, each of the ceramic green sheets may include thereon a surface conductor pattern that provides surface conductors, an inner conductor pattern that provides inner conductors, and via conductors that provide interlayer coupling.

The ceramic green sheets were punched to make a 200 mm×200 mm hole. Four ceramic green sheets separated from the PET films were piled up to provide a multilayer body identical to that prepared in Preferred Embodiment 1, i.e., a multilayer body having dimensions in plan view of 200 mm×200 mm and a thickness of 0.2 mm.

Figure 6:
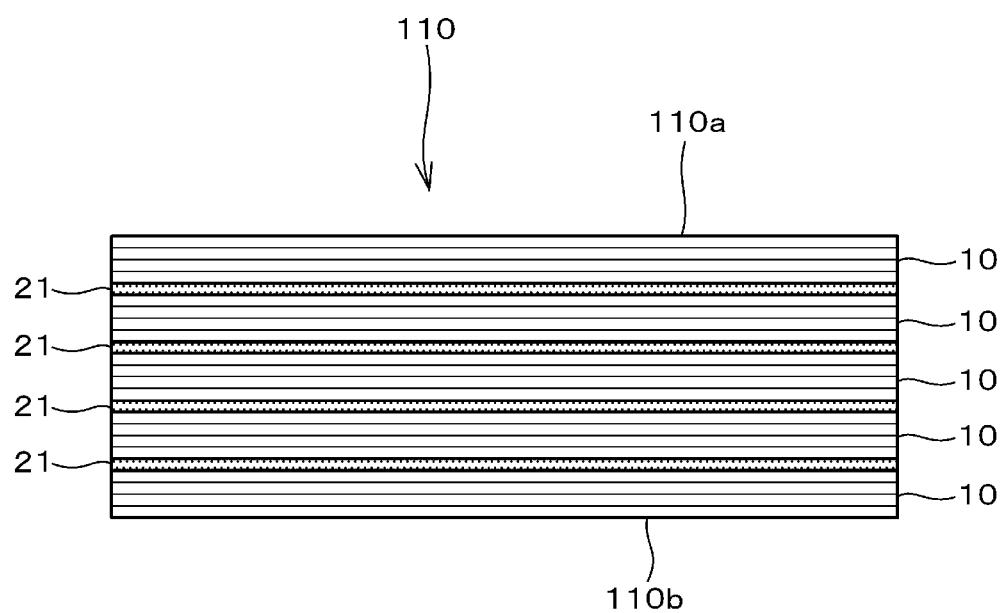
FIG. 6 is a front view of an unfired composite multilayer body formed by stacking five multilayer bodies with a resin layer therebetween, each of the multilayer bodies being a stack of ceramic green sheets, in Preferred Embodiment 2 of the present invention.

(2) As illustrated in FIG. 6, five multilayer bodies (separate unfired mother ceramic substrates) 10 were stacked with 10-μm-thick resin layers 21 therebetween to form a composite multilayer body (unfired composite multilayer body) 110.

More specifically, the top surface of one multilayer body 10 is coated with a resin paste that burns away when heated in the subsequent firing step, forming a resin layer 21. A multilayer body 10 having dimensions in plan view of 200 mm×200 mm and a thickness of 0.2 mm was placed on the resin layer 21. This was repeated to form the unfired composite multilayer body 110 as a stack of five multilayer bodies 10. Instead of the resin paste, the resin layers 21 may be resin sheets that burn away when heated in the firing step.

(3) After degassing in a bag, the unfired composite multilayer body 110 was tightly sealed and heated to a predetermined temperature. Isostatic pressing was then performed at 20 MPa for 1 minute.

Figure 7:
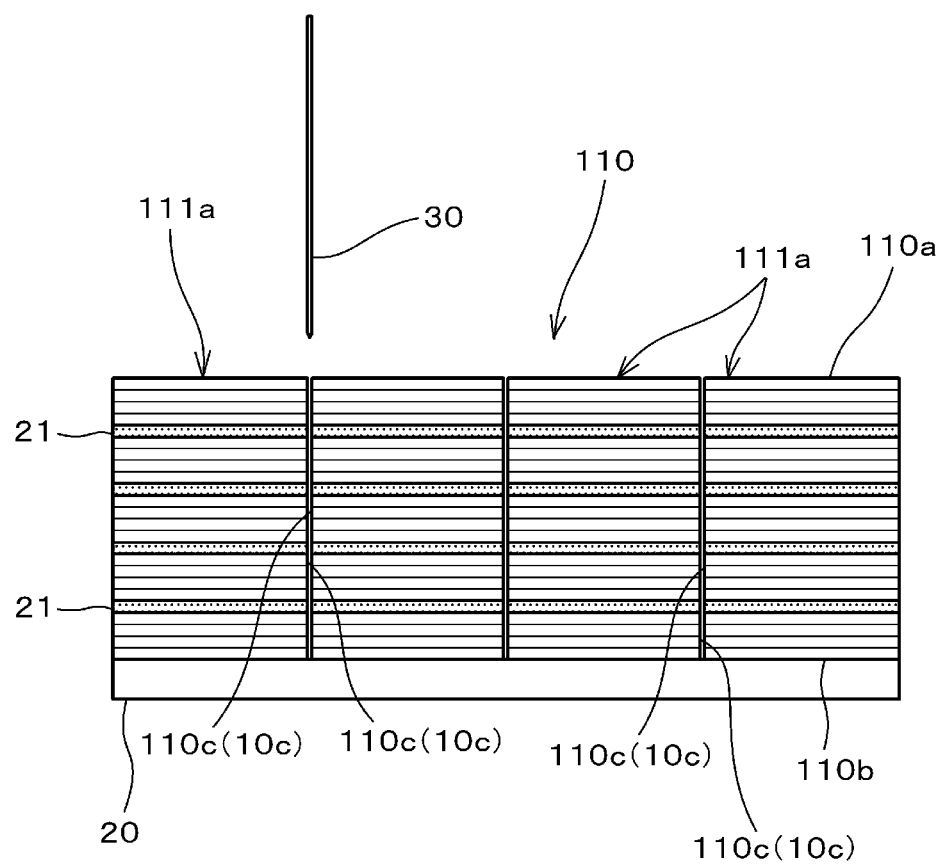
FIG. 7 is a front view of the unfired composite multilayer body in FIG. 6 that had been cut.

(4) The pressed unfired composite multilayer body 110 was cut at 2.44-mm intervals by push-cutting using a 0.10-mm-thick cutting blade 30 on an adhesive holding sheet 20 as illustrated in FIG. 7.

In this process of cutting the unfired composite multilayer body 110, the cutting blade 30 was infiltrated until its edge reached the adhesive holding sheet 20, i.e., from one main surface 110a of the unfired composite multilayer body 110 to the other main surface 110b.

The end surfaces 110c (10c) created through cutting (cross-sectional end surfaces) are perpendicular or substantially perpendicular to the main surfaces 110a and 110b of the unfired composite multilayer body 110.

While being cut, the unfired composite multilayer body 110 is stuck on the adhesive holding sheet 20. This ensures that the cut multilayer pieces 111a are held in the same positions as before cutting and do not break up.

(5) After degassing in a bag, the cut unfired composite multilayer body 110 was tightly sealed and heated to a predetermined temperature. Isostatic pressing was then performed at 100 MPa for 1 minute. In this step of isostatic pressing, the unfired composite multilayer body 110 is isostatically pressed such that pressure is applied not only in the direction perpendicular or substantially perpendicular to its main surfaces 110a and 110b but also in the direction parallel or substantially parallel to its main surfaces 110a and 110b. This provides a joint body (joint unfired composite multilayer body) 110X that exists as a whole unit again as a result of the joining of the end surfaces created through cutting (cross-sectional end surfaces) 110c (10c) as illustrated in FIG. 8.

(6) The margins of the joint body (joint unfired composite multilayer body) 110X are cut away to provide a 180 mm×180 mm joint body.

Figure 8:
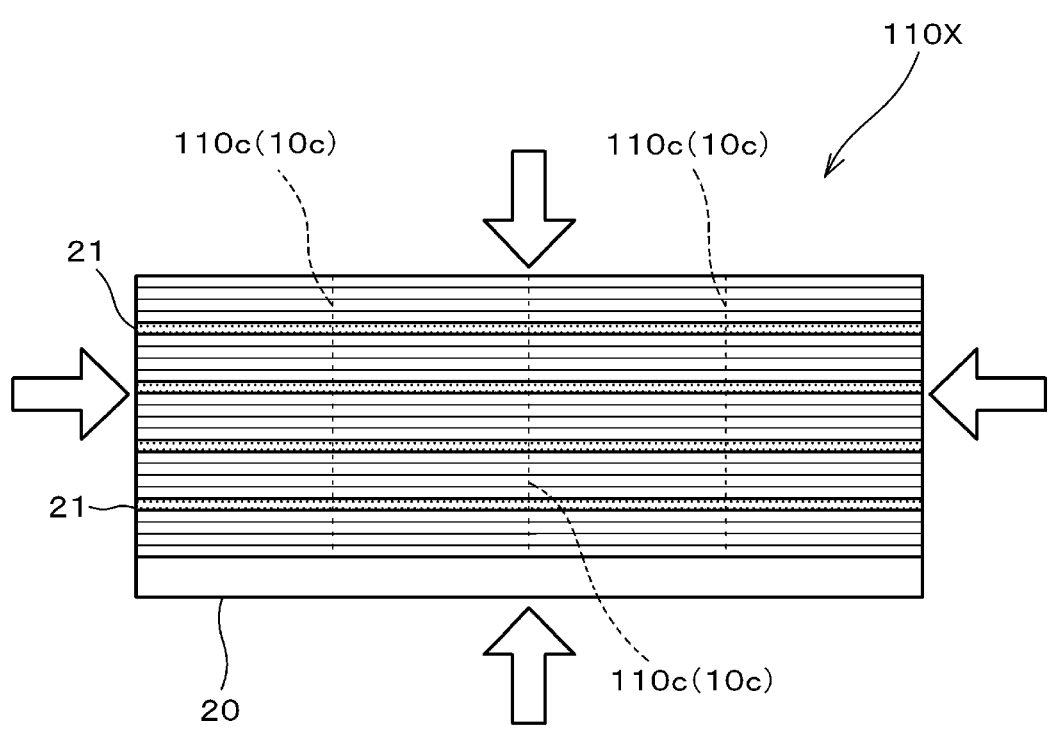
FIG. 8 is a front view of the cut unfired composite multilayer body in FIG. 7 that had been pressed (isostatically pressed) to join the cross-sectional end surfaces created in the cutting step.

The unfired composite multilayer body illustrated in FIGS. 6 to 8 does not include the margins to be cut away.

Figure 9:
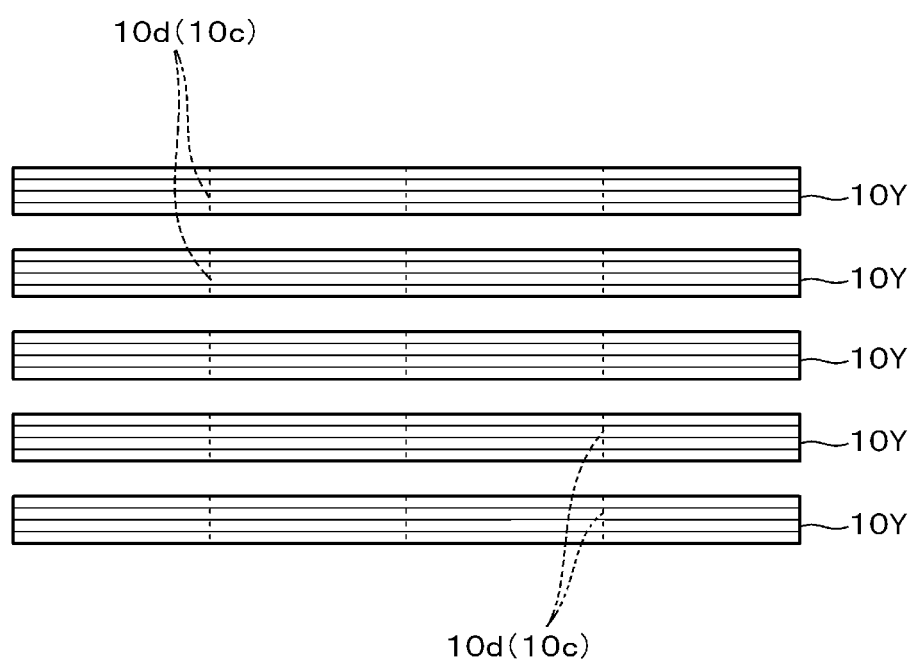
FIG. 9 is a front view of the separate mother ceramic substrates obtained after firing a composite multilayer body in which cross-sectional end surfaces have been joined in a pressing step.

(7) After removal of the adhesive holding sheet 20 from the joint body (joint unfired composite multilayer body) 110X, firing was performed at 950° C. for 2 hours. The resin layers 21 burn away, giving sintered mother ceramic substrates 10Y (FIG. 9), separate mother ceramic substrates released from the resin layers 21 that have bonded them together (FIG. 8).

In the sintered mother ceramic substrates 10Y at this stage the cross-sectional end surfaces 10c are still joined, holding the whole sintered mother ceramic substrate 10Y together as a single unit.

Each of the sintered mother ceramic substrates 10Y has dimensions in plan view of 150 mm×150 mm and a thickness of 150 μm. The mother ceramic substrate also has areas 10d formed in the longitudinal and lateral directions at 2-mm intervals as a result of joining the end surfaces (cross-sectional end surfaces) 10c and where the substrate is weaker than in the other areas and is to be divided (end surface junctions).

Figure 10:
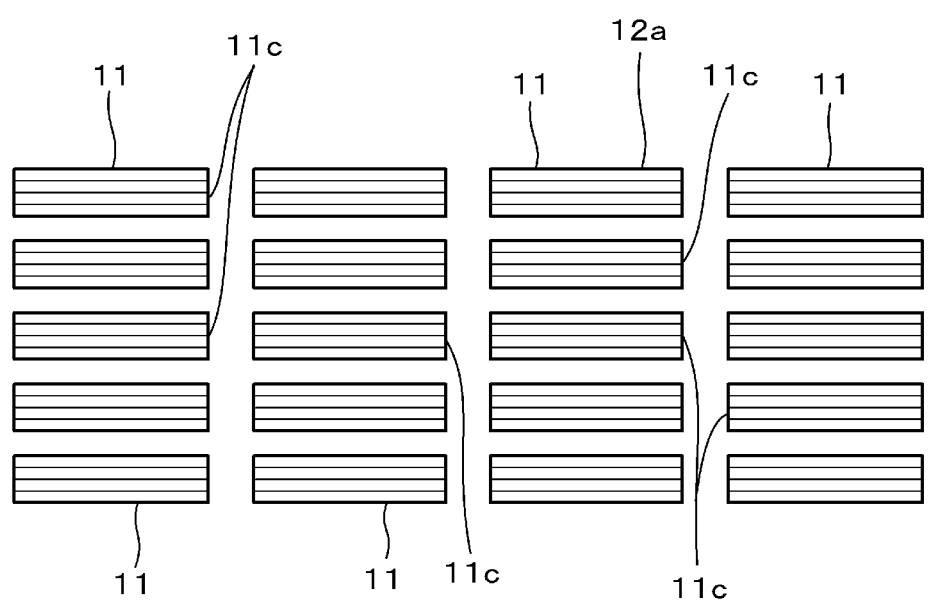
FIG. 10 is a schematic front view of the fired mother ceramic substrates that had been divided into separate ceramic substrates.

(8) Each sintered mother ceramic substrate 10Y was broken on a 10-μm-thick adhesive PET film (not illustrated) using a roller breaker to divide the mother ceramic substrate 10Y into separate sintered ceramic substrates 11 (see FIG. 10). As a result, each sintered mother ceramic substrate 10Y was divided along the end surface junctions 10d, and ceramic substrates (multilayer ceramic substrates) 11 were obtained with their end surfaces 11c resulting from division perpendicular or substantially perpendicular to their main surface 12a and therefore with high dimensional and form accuracy.

In this method according to Preferred Embodiment 2, the (4) cutting step, the (5) pressing step for joining end surfaces, and the (7) firing step can be performed with multiple mother ceramic substrates stacked into a composite multilayer body. This method therefore allows for efficient production of ceramic substrates (multilayer ceramic substrates) with high dimensional and form accuracy.

Variation of Preferred Embodiment 2

Figure 11:
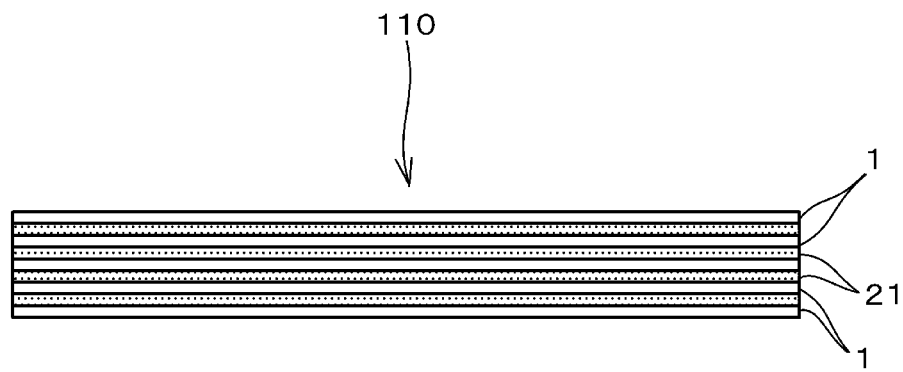
FIG. 11 is a front view of a variation of Preferred Embodiment 2 of the present invention.

In Preferred Embodiment 2, four ceramic green sheets were piled up into a multilayer body (unfired mother ceramic substrate) 10, and five multilayer bodies 10 were stacked with resin layers 21 therebetween to form a composite multilayer body (unfired composite multilayer body) 110. Alternatively, five single-layer ceramic green sheets 1 may be stacked with resin layers 21 therebetween to form a composite multilayer body (unfired composite multilayer body) 110 that has four resin layers 21 and five single-layer ceramic green sheets 1 as illustrated in FIG. 11.

Single-layer ceramic substrates can be efficiently produced by repeating the same steps as in Preferred Embodiment 2 except that the formation of the composite multilayer body (unfired composite multilayer body) 110 is as described above. No detailed descriptions or drawings are given for the steps other than the step of forming the composite multilayer body (unfired composite multilayer body) 110, which are the same as in Preferred Embodiment 2.

In this variation of Preferred Embodiment 2, too, the ceramic green sheets may have a surface conductor pattern formed thereon that provides surface conductors or alternatively have no such element.

In this method, as in Preferred Embodiment 2, all steps can be performed with multiple ceramic green sheets stacked into a composite multilayer body. This method therefore allows for efficient production of ceramic substrates (ceramic articles) with high dimensional and form accuracy.

Preferred Embodiment 3

Figure 12:
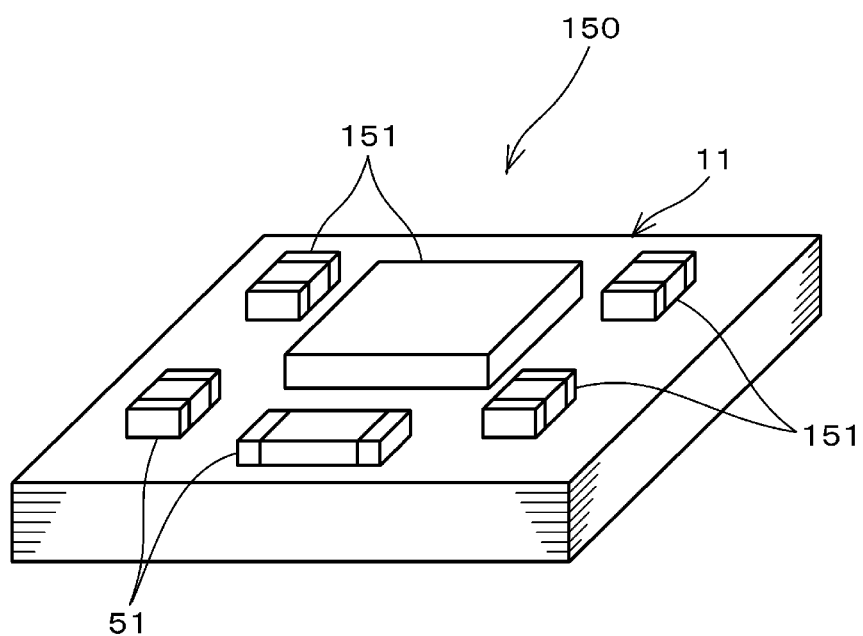
FIG. 12 is a perspective view of the structure of a module component produced using a method according to Preferred Embodiment 3 for the production of module components.

Preferred Embodiment 3 provides a method for the production of module components 150 that each include a multilayer ceramic substrate 11 including elements such as surface conductors, inner conductors, and via conductors and surface mount devices 151 on the multilayer ceramic substrate 11 as illustrated in FIG. 12.

Figure 13:
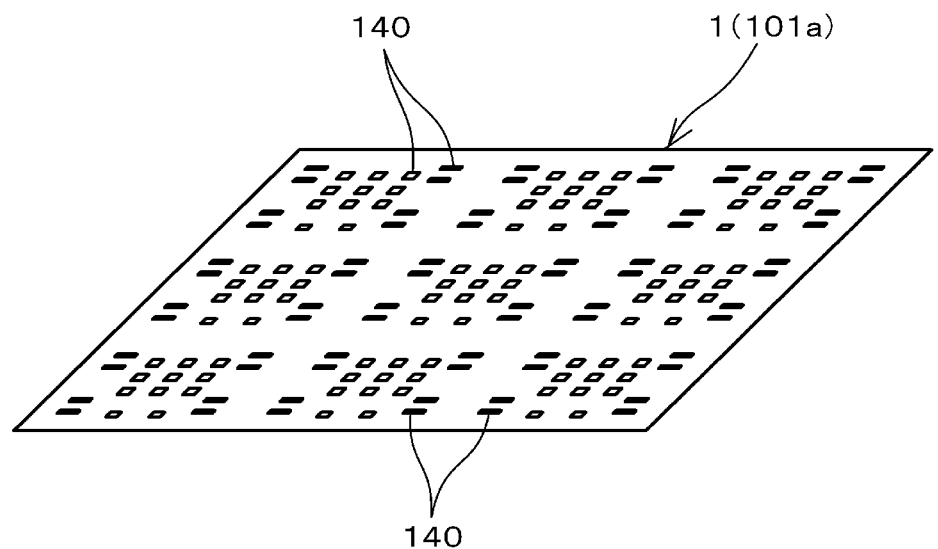
FIG. 13 is a perspective view of a patterned sheet in Preferred Embodiment 3 of the present invention, which was a ceramic green sheet with a conductor pattern placed thereon.

(1) Ceramic green sheets 1 are prepared in the same way as in Preferred Embodiment 1. The resulting ceramic green sheets 1 are subjected to some operations, e.g., the formation of conductor patterns that provide surface conductors and inner conductors, the formation of via holes, and the filling of the via holes with a conductor material that forms via conductors, to provide patterned sheets 101a that each have necessary conductor patterns 140 as illustrated in FIG. 13.

Figure 14:
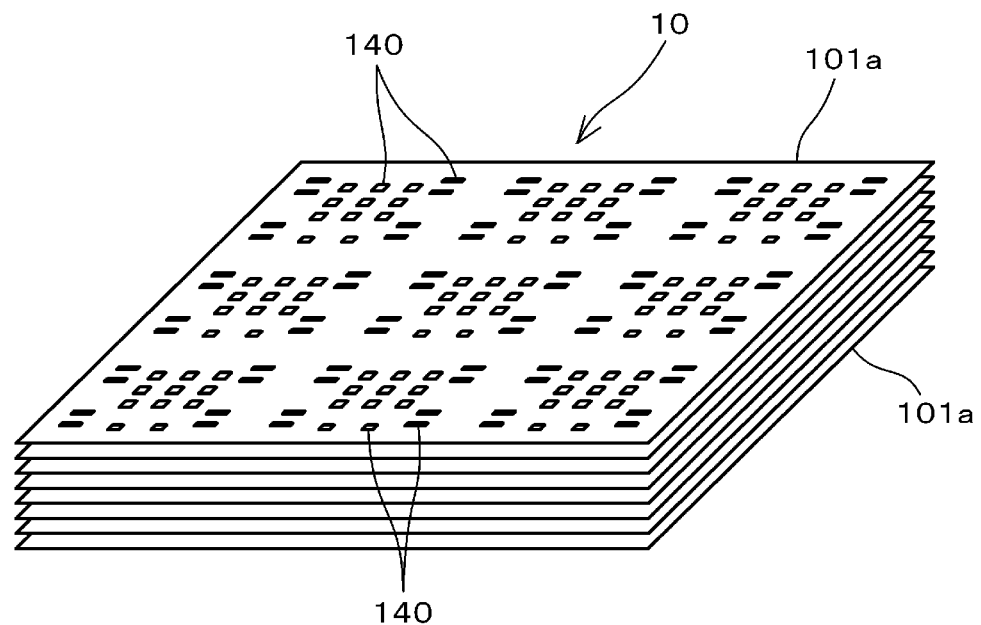
FIG. 14 is a perspective view of patterned sheets of FIG. 13 stacked in a predetermined order.
Figure 15:
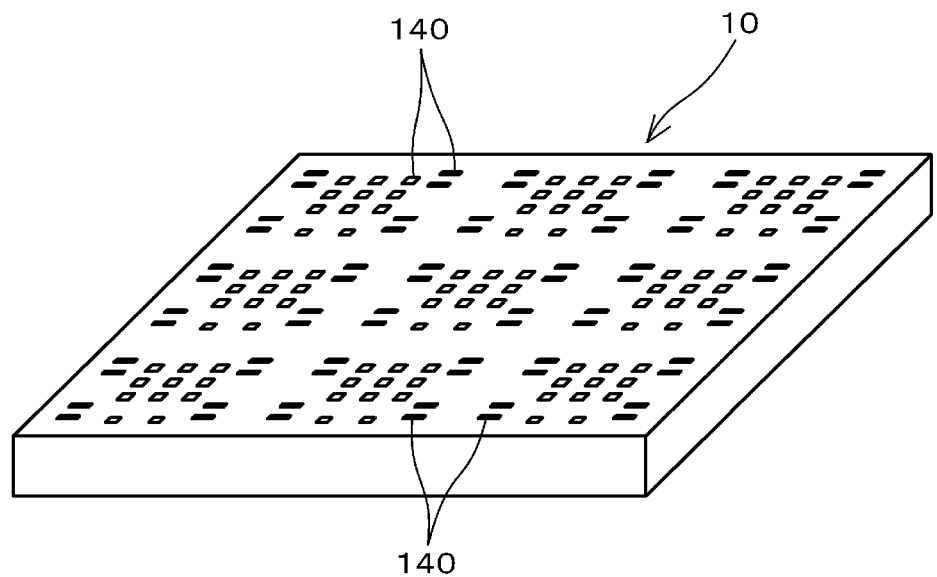
FIG. 15 is a perspective view of a multilayer body (an unfired mother ceramic substrate) obtained by pressure-bonding a stack of patterned sheets of FIG. 13.

(2) The patterned sheets 101a with conductor patterns 140 are stacked in a predetermined order (FIG. 14). After degassing in a bag, the multilayer body was tightly sealed, heated to a predetermined temperature, and isostatically pressed to provide a multilayer body (unfired mother ceramic substrate) 10 that was a pressure-bonded stack of the patterned sheets 101a as illustrated in FIG. 15.

Figure 16:
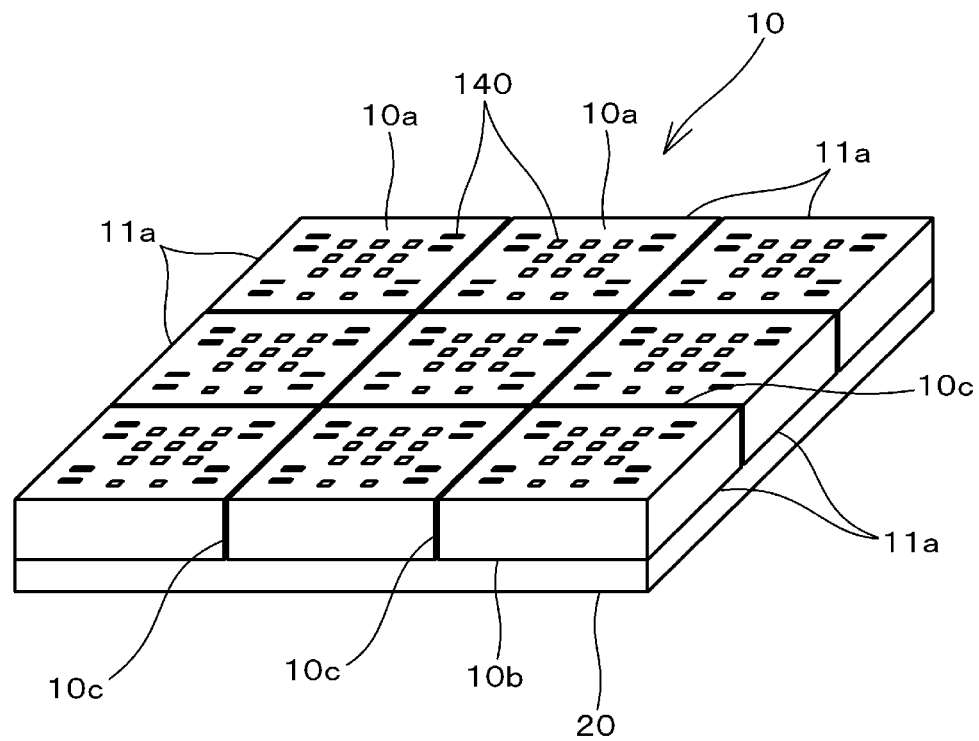
FIG. 16 is a perspective view of the multilayer body (unfired mother ceramic substrate) in FIG. 15 that had been cut.

(3) The unfired mother ceramic substrate 10 was cut at predetermined intervals by push-cutting using a 0.10-mm-thick cutting blade (not illustrated) on an adhesive holding sheet 20 as illustrated in FIG. 16.

In this process of cutting the unfired mother ceramic substrate 10, the cutting blade was infiltrated until its edge reached the adhesive holding sheet 20, i.e., from one main surface 10a of the unfired mother ceramic substrate 10 to the other main surface 10b.

The end surfaces 10c created through cutting (cross-sectional end surfaces) are perpendicular or substantially perpendicular to the main surfaces 10a and 10b of the unfired mother ceramic substrate 10.

While being cut, the unfired mother ceramic substrate 10 is stuck on the adhesive holding sheet 20. This ensures that the cut pieces (individual pieces that are to be fired into ceramic substrates (unfired ceramic substrates)) 11a (FIG. 16) are held in the same positions as before cutting and do not break up.

Figure 17:
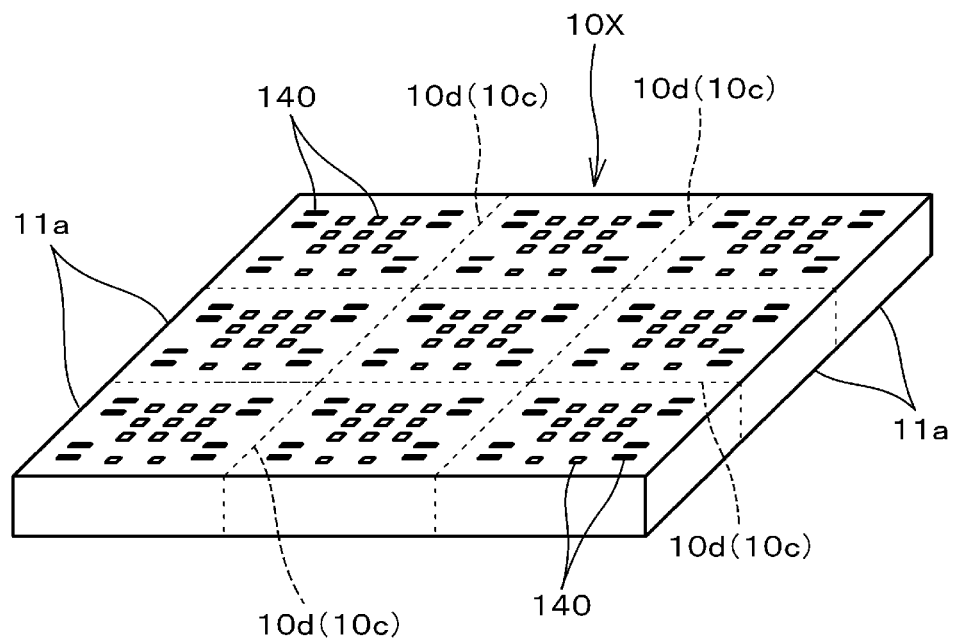
FIG. 17 is a perspective view of the cut unfired multilayer body (unfired mother ceramic substrate) in FIG. 16 that had been pressed (isostatically pressed) to join the cross-sectional end surfaces created in the cutting step.

(4) After degassing in a bag, the cut unfired mother ceramic substrate 10 was tightly sealed and heated to a predetermined temperature. Isostatic pressing was then performed at 100 MPa for 1 minute. In this step of isostatic pressing, the unfired mother ceramic substrate 10 is isostatically pressed in such a manner that pressure is applied in the direction parallel or substantially parallel to its main surfaces 10a and 10b. This provides an unfired mother ceramic substrate 10X that includes end surface junctions 10d, areas resulting from joining the end surfaces 10c created through cutting (cross-sectional end surfaces) (a joint unfired mother ceramic substrate existing as a whole unit as a result of the joining of the cross-sectional end surfaces 10c) (FIG. 17).

(5) The margins of the joint unfired mother ceramic substrate 10X are cut away to provide a 180 mm×180 mm joint body.

The unfired mother ceramic substrate illustrated in FIGS. 13 to 17 does not include the margins to be cut away.

Figure 18:
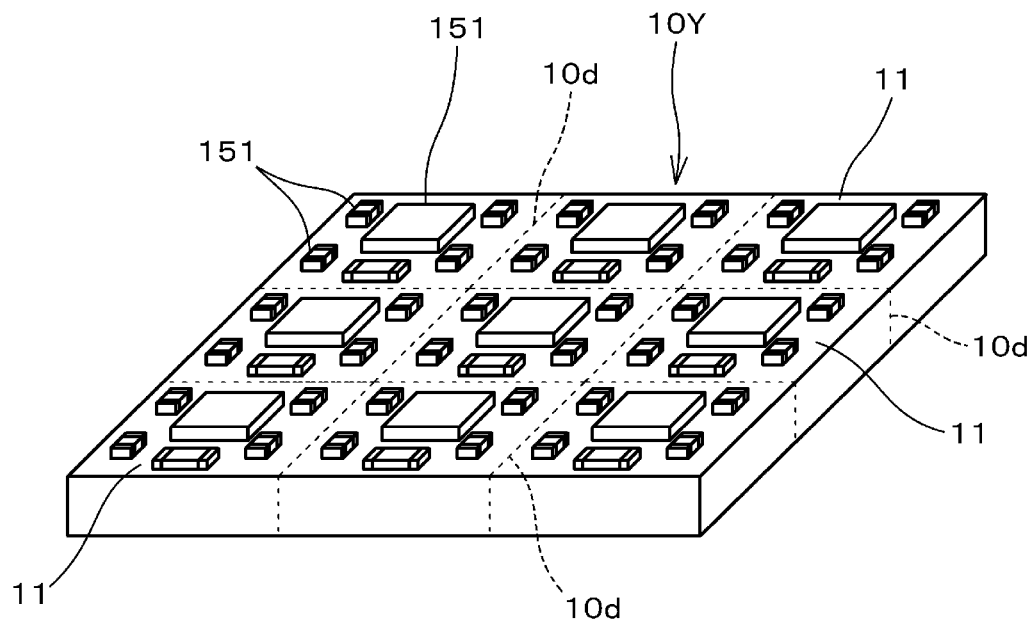
FIG. 18 is a perspective view of the mother ceramic substrate in FIG. 17 that had been fired with its cross-sectional end surfaces joined and to which surface mount devices had been mounted.

(6) After removal of the adhesive holding sheet 20 from the joint unfired mother ceramic substrate 10X, firing was performed at 950° C. for 2 hours to provide a sintered mother ceramic substrate 10Y (FIG. 18).

The end surfaces (cross-sectional end surfaces) 10c are still joined at this stage, holding the whole sintered mother ceramic substrate 10Y together as a single unit.

The sintered mother ceramic substrate 10Y at this stage includes areas 10d that have resulted from joining the cross-sectional end surfaces 10c (FIG. 16) and where the substrate is weaker than in the other areas and is to be divided (end surface junctions).

(7) Each of the surface mount devices 151 was mounted to each of the pieces (ceramic substrates) 11, which are to be fired into ceramic substrates, of the sintered mother ceramic substrate 10Y (FIG. 18).

The surface mount devices 151 mounted are, for example, IC chips, multilayer ceramic capacitors, chip inductors, and chip resistors.

Figure 19:
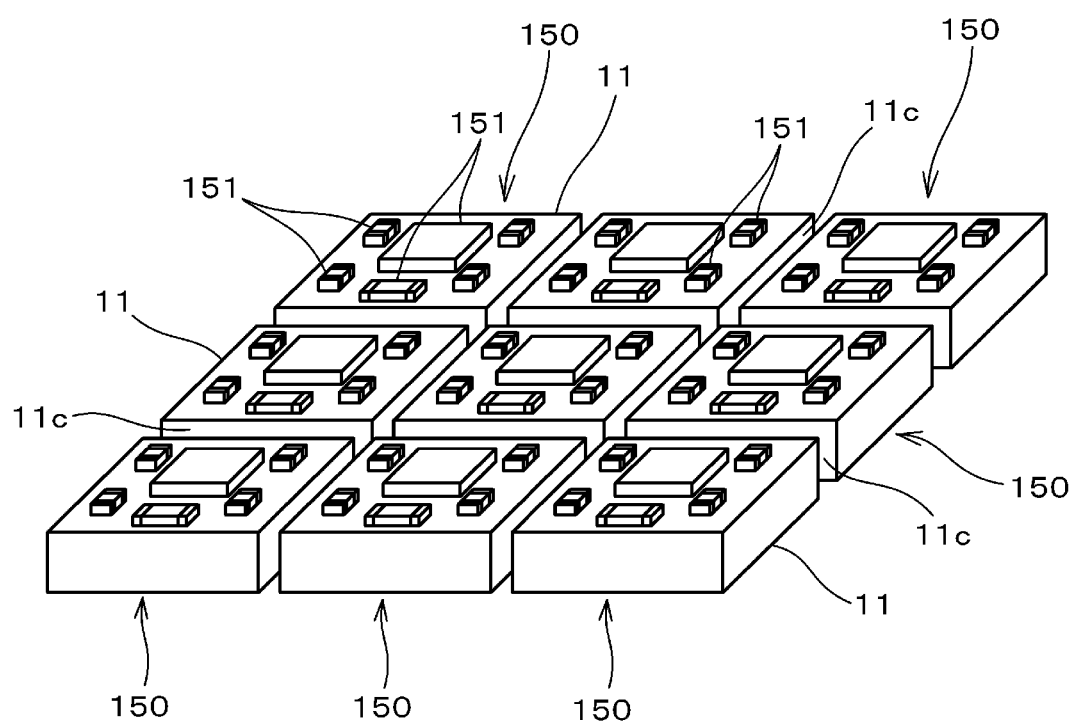
FIG. 19 is a schematic perspective view of the fired mother ceramic substrate that had been broken and divided into separate module components.
Figure 20A:
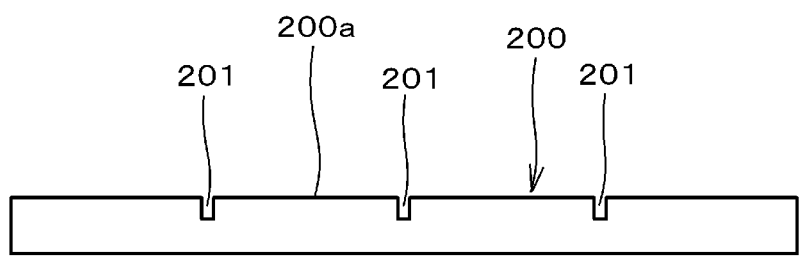
FIG. 20A is a front view of a known method for dividing a mother substrate.
Figure 20B:
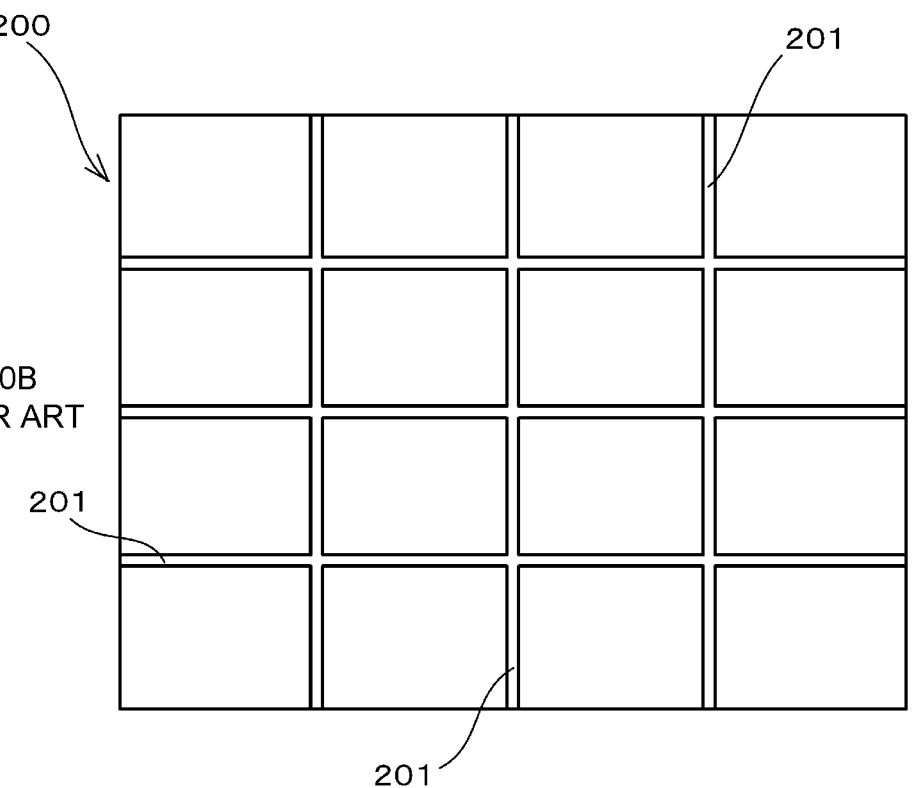
FIG. 20B is a top view of the same.
Figure 21:
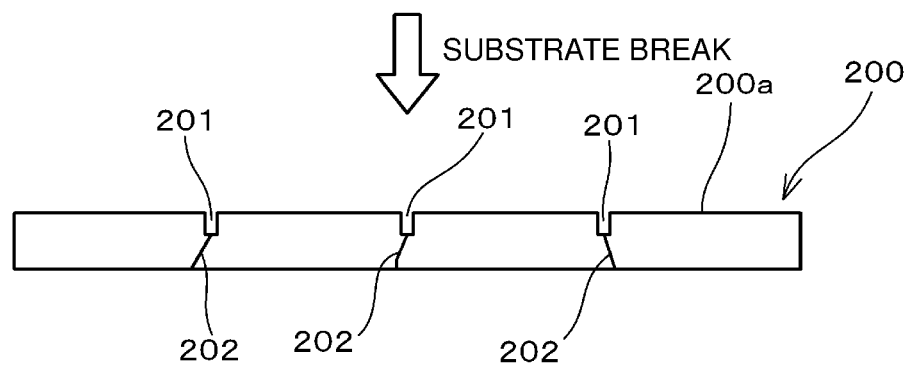
FIG. 21 is a diagram that illustrates a problem with the known method for dividing a mother substrate.

(8) The mother ceramic substrate 10Y with surface mount devices 151 on each ceramic substrate was broken along the end surface junctions 10d (FIG. 19). This provides module components 150 each including a ceramic substrate (multilayer ceramic substrate) 11 and surface mount devices 151 thereon with their end surfaces 11c resulting from division perpendicular or substantially perpendicular to their main surface 12a and therefore with high dimensional and form accuracy.

In this method according to Preferred Embodiment 3, all steps including the cutting, pressing, firing, and mounting steps can together be performed with ceramic substrates in assembly. This method therefore allows for efficient production of module components each including a ceramic substrate and surface mount devices thereon with high dimensional and form accuracy.

Although multilayer ceramic substrates are described as examples in Preferred Embodiments 1 and 2, the present invention is also applicable to the production of single-layer ceramic substrates.

Although module components each including a multilayer ceramic substrate and surface mount electronic devices thereon are described as examples in Preferred Embodiment 3, the present invention is also applicable to the production of module components each including a single-layer ceramic substrate and surface mount electronic devices thereon.

In all other respects, too, the present invention is not limited to the above preferred embodiments. Various applications and modifications within the scope of the present invention can be made to conditions such as the dimensions and shape of the ceramic substrates to be produced and the production process including the cutting method used when cutting the unfired mother ceramic substrate and the equipment for this, the pressing method used in the pressing step, and the method used to break the sintered mother ceramic substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing module components that are produced by dividing a mother ceramic substrate with surface mount devices thereon at a predetermined position into a plurality of separate ceramic substrates, the method comprising:

cutting an unfired mother ceramic substrate that has yet to be fired at a predetermined position from one main surface through to the other main surface to divide the unfired mother ceramic substrate into separate unfired ceramic substrates;

pressing the cut unfired mother ceramic substrate divided into the separate unfired ceramic substrates to apply pressure in a direction parallel or substantially parallel to the main surfaces thereof so that cross-sectional end surfaces created in the cutting are joined, combining the separate unfired ceramic substrates into a single unit;

firing the pressed unfired mother ceramic substrate including an end surface junction, which is an area resulting from joining the cross-sectional end surfaces, to form a fired mother ceramic substrate;

mounting one of the surface mount devices to each of the separate fired ceramic substrates in the fired mother ceramic substrate; and dividing the fired mother ceramic substrate, with a respective one of the surface mount devices on each of the separated fired ceramic substrates, by breaking the fired mother ceramic substrate along the end surface junction to divide the mother ceramic substrate into separate module components each including a respective one of the separate ceramic substrates and the surface mount device thereon.

2. The method according to claim 1, wherein the unfired mother ceramic substrate has a multilayer structure formed by stacking a plurality of ceramic green sheets, and the ceramic substrates as a structural element of the module components obtained by dividing the fired mother ceramic substrate in the dividing are multilayer ceramic substrates.

3. The method according to claim 2, wherein at least one of the plurality of ceramic green sheets includes at least one of a surface conductor, an inner conductor pattern, and a via conductor.

4. The method according to claim 1, wherein the unfired mother ceramic substrate contains a conductor pattern made of a material that becomes a metallic conductor through firing so that the cutting, pressing, firing, mounting, and dividing provide separate module components each including a ceramic substrate including a metallic conductor and the surface mount device on the ceramic substrate.

5. The method according to claim 1, wherein the mother ceramic substrate is formed of a magnetic ceramic material.

6. The method according to claim 1, wherein a stack of the unfired mother ceramic substrates with a resin layer therebetween that burns away in the firing goes through the cutting and pressing and the firing, in which the resin layer burns away, and then each of the fired mother ceramic substrates is subjected to the mounting and dividing.

7. The method according to claim 1, wherein the cross-sectional end surfaces created in the cutting are perpendicular or substantially perpendicular to the main surfaces of the unfired mother ceramic substrate.

8. The method according to claim 1, wherein during the cutting, the unfired mother ceramic substrate is stuck on an adhesive holding sheet.

9. The method according to claim 1, wherein in the pressing, the cut unfired mother ceramic substrate is pressed to apply pressure in a direction perpendicular or substantially perpendicular to the main surfaces thereof.

10. The method according to claim 1, wherein the surface mount devices include at least one of IC chips, multilayer ceramic capacitors, chip inductors and chip resistors.

* * * * *